(12) United States Patent
Jeon

(10) Patent No.: US 7,964,488 B2
(45) Date of Patent: Jun. 21, 2011

(54) SEMICONDUCTOR DEVICE AND METHOD FOR FABRICATING THE SAME

(75) Inventor: Weon-Chul Jeon, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 330 days.

(21) Appl. No.: 12/165,145

(22) Filed: Jun. 30, 2008

(65) Prior Publication Data

US 2009/0096057 A1     Apr. 16, 2009

(30) Foreign Application Priority Data

Oct. 16, 2007    (KR) ........................ 10-2007-0104068

(51) Int. Cl.
*H01L 21/3205* (2006.01)

(52) U.S. Cl. ........ 438/589; 438/197; 438/259; 438/592; 257/E21.428; 257/E21.655

(58) Field of Classification Search .................. 438/197, 438/589, 259, 592; 257/E29.321, E21.384, 257/E21.419, E21.428, E21.655
See application file for complete search history.

(56) References Cited

U.S. PATENT DOCUMENTS

| 7,432,155 B2 * | 10/2008 | Park ............................... 438/259 |
| 2005/0014338 A1 * | 1/2005 | Kim et al. ...................... 438/275 |
| 2005/0020086 A1 * | 1/2005 | Kim et al. ...................... 438/700 |
| 2005/0079661 A1 * | 4/2005 | Cho et al. ....................... 438/197 |
| 2007/0004188 A1 * | 1/2007 | Kim et al. ...................... 438/589 |
| 2007/0082442 A1 * | 4/2007 | Kim ............................... 438/243 |
| 2008/0160700 A1 * | 7/2008 | Lee ................................ 438/270 |

FOREIGN PATENT DOCUMENTS

| KR | 1020010063759 A | 7/2001 |
| KR | 1020050035354 A | 4/2005 |

* cited by examiner

*Primary Examiner* — Michael S Lebentritt
*Assistant Examiner* — Daniel Whalen
(74) *Attorney, Agent, or Firm* — Kilpatrick Townsend & Stockton LLP

(57) ABSTRACT

A semiconductor device includes a substrate where an isolation region and a plurality of active regions are defined, an anti-interference layer formed over the substrate in the isolation region, and a gate line simultaneously crossing the active region and the anti-interference layer.

7 Claims, 4 Drawing Sheets

SEMICONDUCTOR DEVICE AND METHOD FOR FABRICATING THE SAME

CROSS-REFERENCE TO RELATED APPLICATIONS

The present invention claims priority of Korean patent application number 2007-0104068, filed on Oct. 16, 2007, which is incorporated by reference in its entirety.

BACKGROUND OF THE INVENTION

The present invention relates to a semiconductor device and a method for fabricating the same. More particularly, the present invention relates to a semiconductor device that reduces a passing gate effect and a method for fabricating the same.

As semiconductors become highly integrated, electric characteristics such as a threshold voltage and a refresh rate requires an increase when a channel dimension decreases. Thus, a recess gate structure is introduced to increase the channel length by selectively etching a substrate.

FIG. 1A illustrates a top view of a typical semiconductor device.

FIG. 1B illustrates a cross-sectional view of the semiconductor device shown in FIG. 1A cut along a line X-X'.

Referring to FIGS. 1A and 1B, a substrate 11 where isolation region and active region 13 are defined by an insulation layer 12 is selectively etched to form a recess pattern 14. A gate insulation layer 15 is formed over the recess pattern 14. Polysilicon layer 16, tungsten layer 17, and gate hard mask layer 18 are formed over a resultant structure including the recess pattern 14. Then, a patterning process is performed thereon to form gate lines GL. Thus, a plurality of gate lines GL are formed simultaneously crossing the isolation region and the active region 13. The gate lines GL crossing the active region 13 is called a main gate and the gate lines GL crossing the isolation region is called a passing gate.

However, as semiconductor devices become highly integrated, a physical gap between the main gate and the passing gate decreases. Thus, a threshold of the main gate changes and a parasitic capacitance between the main gate and the passing gate increases due to a bias applied to the passing gate. That is, the passing gate effect occurs.

Furthermore, a portion of the isolation layer 12 is etched during an etch process for forming the recess pattern 14 in the aforementioned typical method. Generally, the isolation layer 12 is etched down to approximately ⅔ to approximately ½ of the recess pattern 14. The damage of the isolation layer 12 decreases the physical gap between the main gate and the passing gate (refer to 'A' area of FIG. 1B). Thus, the described passing effect becomes more intense.

SUMMARY OF THE INVENTION

Embodiments of the present invention relate to a semiconductor device reducing a passing gate effect and a method for fabricating the same. This invention increases a physical gap between a main gate and a passing gate to reduce the passing gate effect.

In accordance with an aspect of the present invention, there is provided a semiconductor device including a substrate where an isolation region and a plurality of active regions are defined, an anti-interference layer formed over the substrate in the isolation region, and a gate line simultaneously crossing the active region and the anti-interference layer.

In accordance with another aspect of the present invention, there is provided a method for fabricating a semiconductor device. The method includes forming an anti-interference pattern exposing a portion of a substrate in an active region over the substrate including an isolation region and an active region, forming a gate conductive layer over a resultant structure including the anti-interference pattern, forming a gate hard mask layer over the gate conductive layer, and selectively etching the gate hard mask layer, the gate conductive layer, and the anti-interference pattern to form a plurality of gate lines simultaneously crossing the isolation region and the active region.

DESCRIPTION OF SPECIFIC EMBODIMENTS

Embodiments of the present invention relate to a semiconductor device for reducing a passing gate effect and a method for fabricating the same.

Figure 1A:
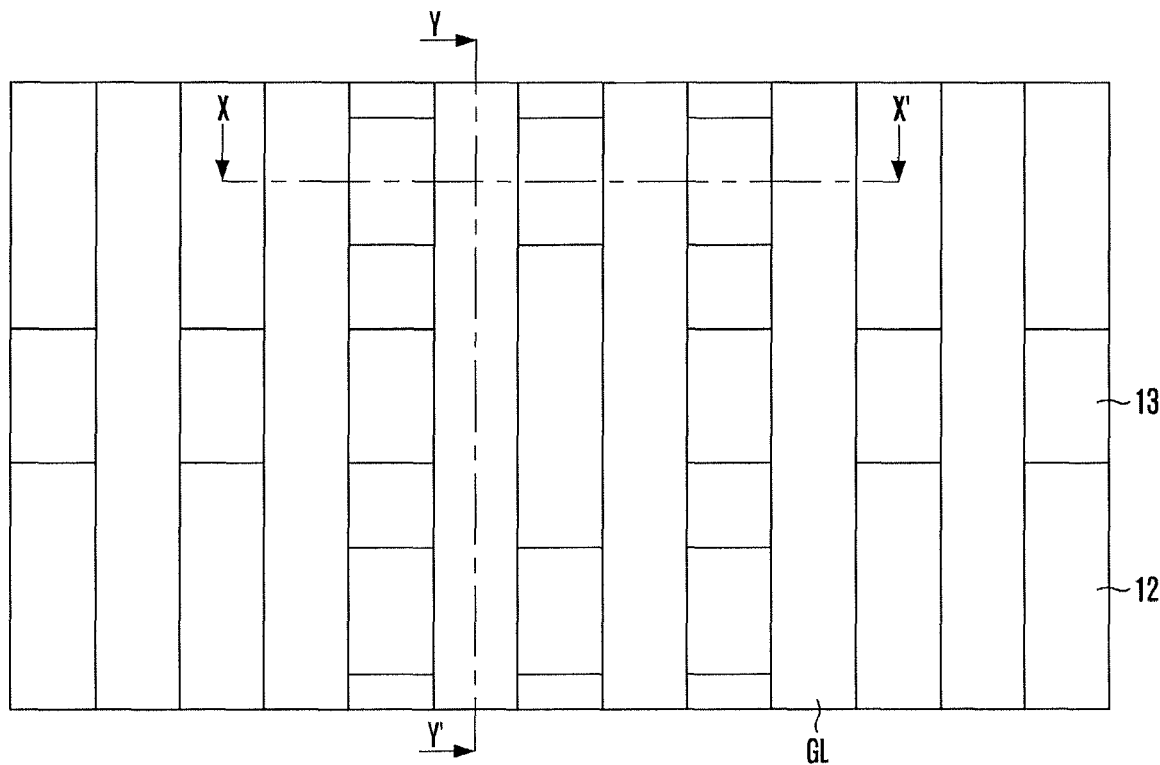
FIG. 1A illustrates a top view of a typical semiconductor device.
Figure 1B:
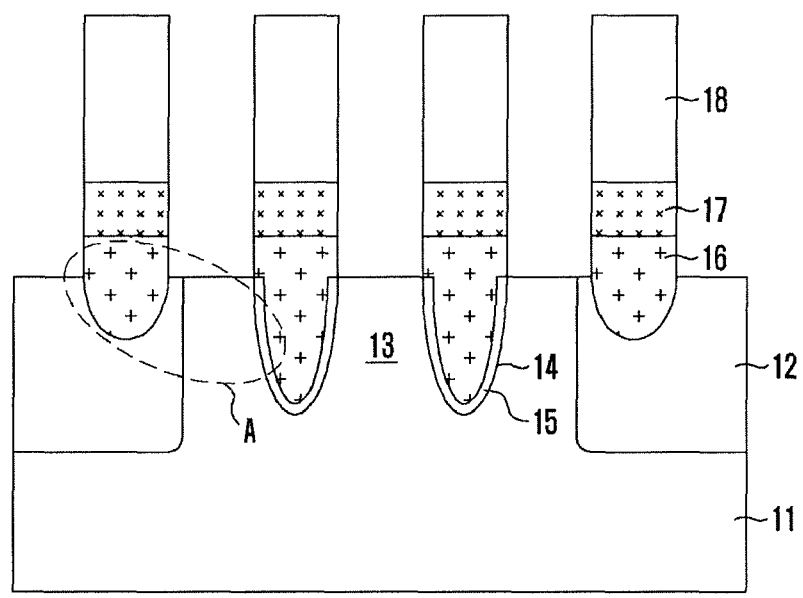
FIG. 1B illustrates a cross-sectional view of the semiconductor device shown in FIG. 1A cut along a line X-X'.
Figure 2:
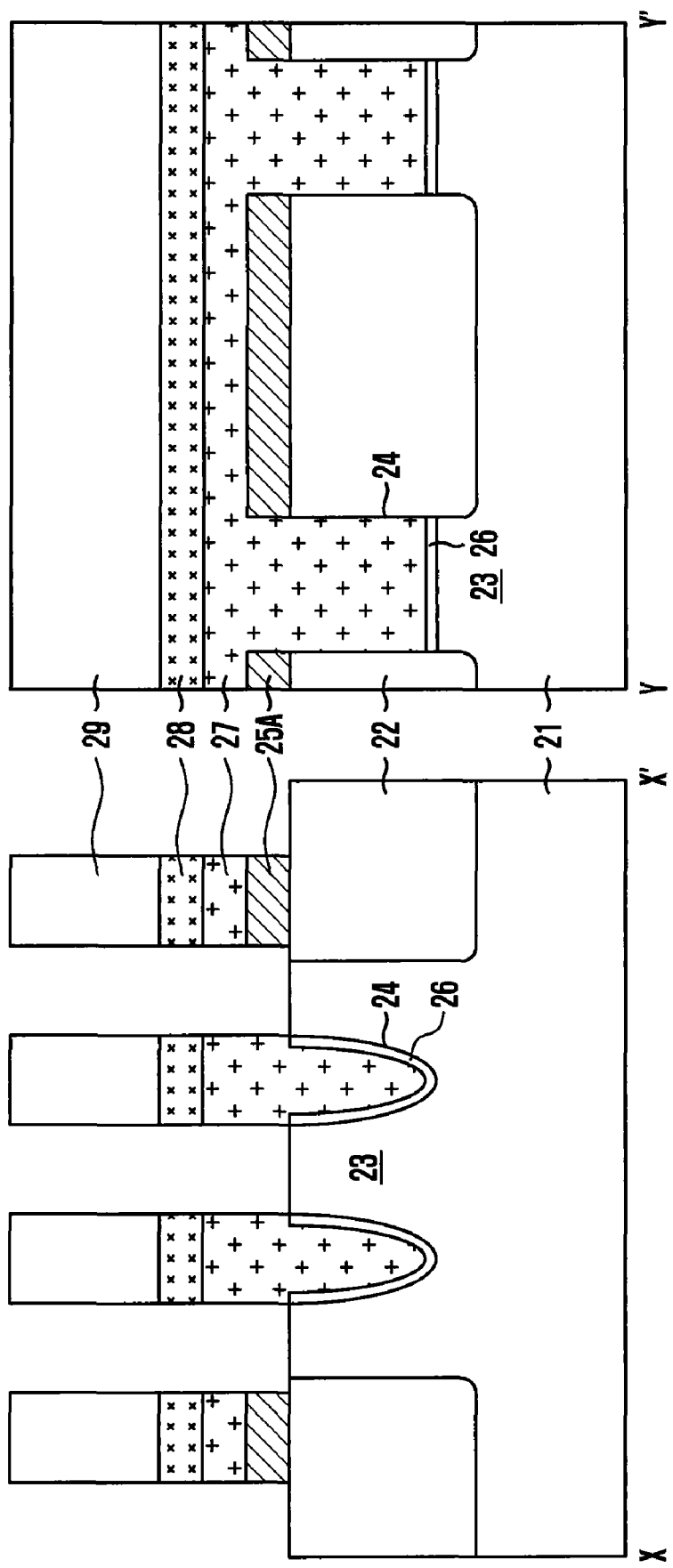
FIG. 2 illustrates a cross-sectional view of a semiconductor device in accordance with an embodiment of the present invention, the cross-sectional view oriented as shown in FIG. 1A cut along the line X-X'.

FIG. 2 illustrates a cross-sectional view of a semiconductor device in accordance with an embodiment of the present invention, the cross-sectional view oriented as shown in FIG. 1A cut along the line X-X'.

Referring to FIG. 2, the semiconductor device in this invention includes a substrate 21 where a plurality of active regions 23 are defined by an isolation region 22, an anti-interference layer 25A formed over the substrate 21, and a plurality of gate lines GL simultaneously crossing the active region 23 and the anti-interference layer 25A.

The anti-interference layer 25A increases a gap between a gate line crossing the active region 23 (i.e., a main gate) and a gate line crossing the isolation layer 22 (i.e., a passing gate), thereby reducing a passing gate effect. The anti-interference layer 25A may include any materials having an insulation characteristic and formed to have a thickness of approximately 100 Å to approximately 1,000 Å.

For instance, the anti-interference layer 25A may include one selected from the group consisting of an oxide layer, a nitride layer, an oxynitride layer, a carbon (C) containing layer, and a combination thereof. The oxide layer may include one of a silicon oxide ($SiO_2$) layer, a boron phosphorus silicate glass (BPSG) layer, a phosphorus silicate glass (PSG) layer, a tetra ethyl ortho silicate (TEOS) layer, an un-doped silicate glass (USG) layer, a spin on glass (SOD) layer, a high density plasma (HDP) layer, and a spin on dielectric (SOD) layer. The nitride layer may include a silicon nitride ($Si_3N_4$) layer and the C containing layer may include an amorphous carbon layer (ACL) or a carbon rich polymer layer.

Although not shown, the anti-interference layer 25A may include a gate insulation layer formed between the passing gate and the substrate 21 in the isolation region 22.

The gate lines GL simultaneously crossing the active region 23 and the anti-interference layer 25A may further include a recess structure formed over the substrate 21 in the active region 23. The recess structure may be of a polygon type, a bulb type, or a saddle type. The bulb type indicates a recess structure having a wider lower portion than an upper portion thereof. Generally, the lower portion has a round type. The saddle type indicates a recess structure formed with a projection such as a fin at a bottom.

The gate lines GL may have a stack structure of a gate insulation layer 26, a first gate conductive layer 27, a second gate conductive layer 28, and a gate hard mask layer 29. The gate insulation layer 26 may include a silicon oxide layer. The first gate conductive layer 27 may include the gate insulation layer 26, e.g., the silicon oxide layer or a polysilicon layer having good interfere characteristic. The second gate conductive layer 28 may include one selected from the group consisting of a polysilicon layer, a metal layer (such as a tungsten layer or a nickel layer), a conductive metal nitride layer (such as a titanium nitride layer), a metal silicide layer (such as a tungsten silicide layer or a nickel silicide layer), and a combination thereof. The gate hard mask layer 29 may include one selected from the group consisting of an oxide layer, nitride layer, nitride oxide layer, C containing layer, and a combination thereof.

As described, the anti-interference layer 25A is formed over the substrate 21 in the isolation region 22 where the gate lines GL is crossed. Thus, the physical gap between the main gate and the passing gate increases to thereby reduce the passing gate effect.

Figure 3A:
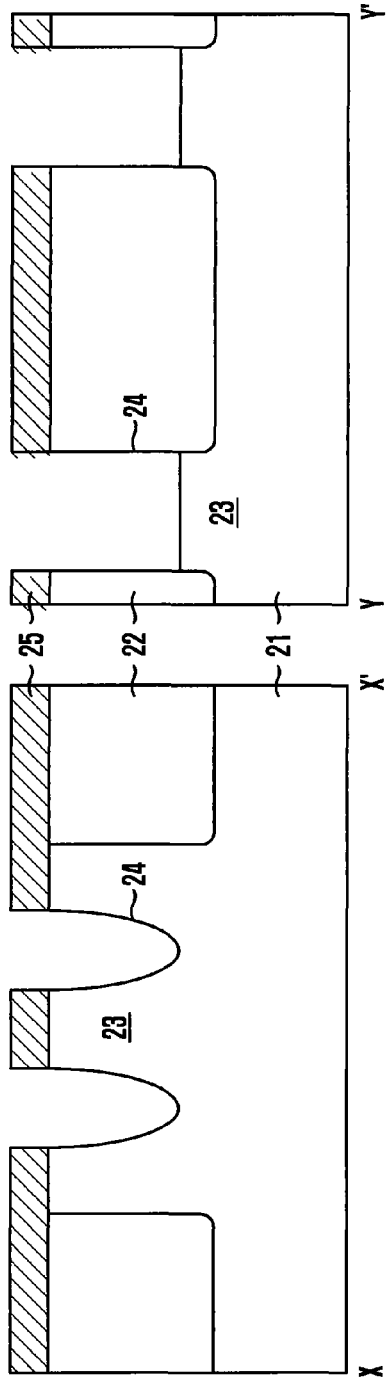
FIGS. 3A to 3C illustrate cross-sectional views describing a method for fabricating the semiconductor device in accordance with an embodiment of the present invention.
Figure 3B:
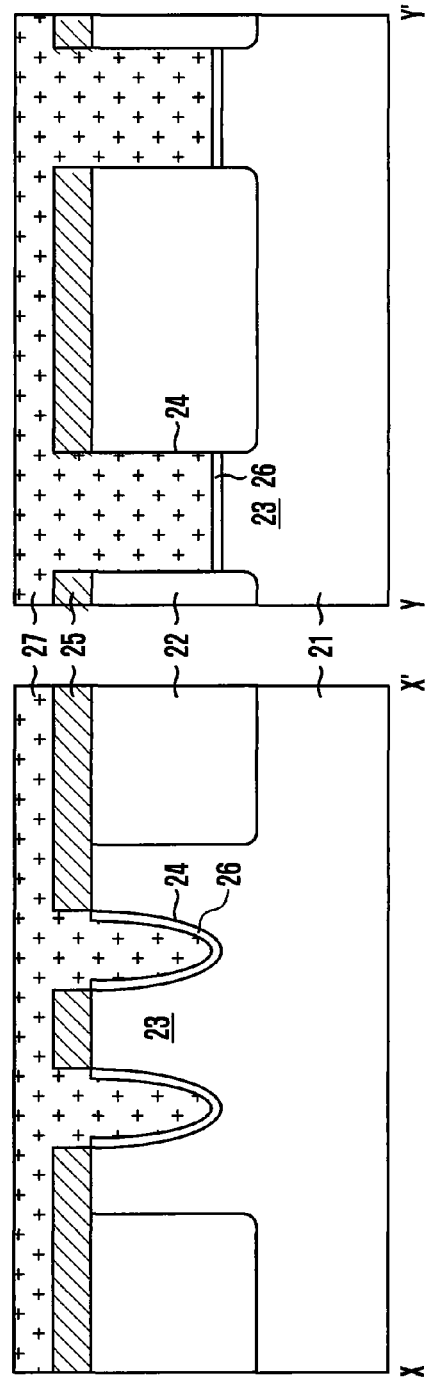
Figure 3C:
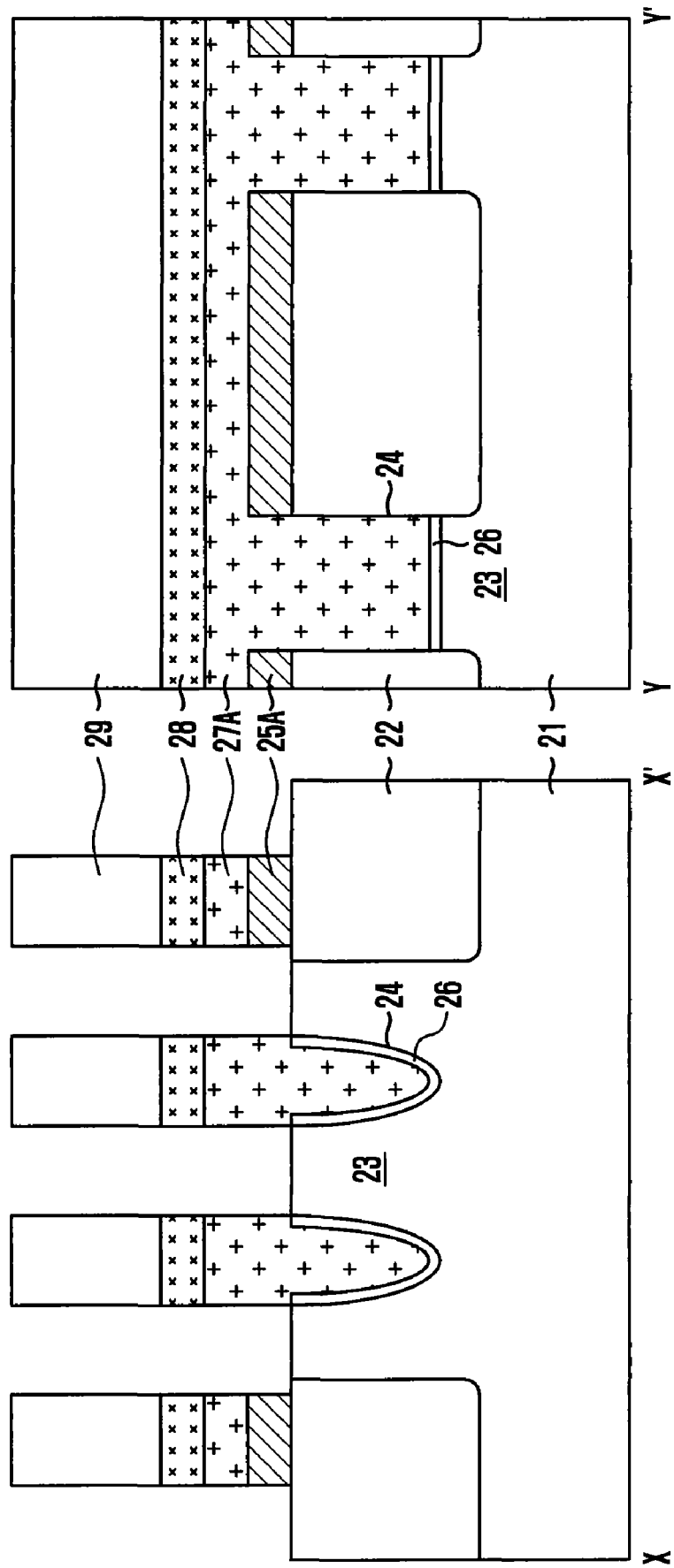

FIGS. 3A to 3C illustrate cross-sectional views describing a method for fabricating the semiconductor device in accordance with an embodiment of the present invention.

Referring to FIG. 3A, a hard mask pattern including a pad oxide layer and a pad nitride layer is formed over the substrate 21. A trench is formed using the hard mask pattern as an etch barrier.

Sidewall oxide layer, liner nitride layer, and liner oxide layer are formed on a surface of the trench. Thus, an insulation layer for isolation is gap filled in the trench. The insulation layer for isolation may include an oxide layer, e.g. an HDP layer or a SOD layer.

The insulation layer for isolation layer is planarized to expose the pad nitride layer, and then the hard mask pattern is removed to form an isolation layer.

The region where the isolation layer is formed is referred to as an isolation region 22. The other region of the substrate 21 excluding the isolation region is not formed is referred as an active region 23. The anti-interference layer is deposited on the substrate 21 with the isolation region 22 and active region 23. The insulation layer for anti-interference may include one selected from the group consisting of an oxide layer, nitride layer, oxynitride layer, C containing layer, and a combination thereof.

The isolation layer for anti-interference decreases a gap between a subsequent main gate and passing gate. Thus, the physical gap between the main gate and the passing gate is increased to thereby reduce the passing gate effect. The isolation layer for anti-interference may also be used as an etch barrier during an etch process. When performing the etch process for forming the recess pattern, a portion of the insulation layer for anti-interference may be damaged. Thus, the insulation layer for anti-interference may have a thickness of more than approximately 100 Å, e.g., a thickness of approximately 100 Å to approximately 1,000 Å. An anti-interference pattern 25 is formed to expose a portion of the substrate 21 by selectively etching the insulation layer for anti-interference.

Referring to FIG. 3B, a recess pattern 24 is formed by etching the substrate 21 in the active region 23 using the anti-interference pattern 25 as an etch barrier.

The recess structure may be one selected from the group consisting of a polygon, a bulb type, and a saddle type.

A gate insulation layer 26 is formed over the substrate 21 in the active region 23 exposed by the anti-interference pattern 25. The gate insulation layer 26 can be formed through a thermal oxidation process and include a $SiO_2$ layer.

A first gate conductive layer 27 is formed over a resultant structure including the gate insulation layer 26. The first gate conductive layer 27 may be a polysilicon layer having fine interface characteristic with the gate insulation layer 26, e.g., the silicon oxide layer.

The first gate conductive layer 27 is planarized to remove a height difference thereof formed by the anti-interference pattern 25. As a result, a first gate conductive pattern 27A is formed. The planarization process is performed using a chemical mechanical polishing (CMP) method.

Referring to FIG. 3C, a second gate conductive layer 28 is formed over the first gate conductive pattern 27A. The second gate conductive layer 28 may include one selected from the group consisting of a polysilicon layer, a metal layer (such as a tungsten layer or a nickel layer), a conductive metal nitride layer (such as a titanium nitride layer), a metal silicide layer such as a tungsten silicide layer or a nickel silicide layer, and a combination thereof.

A gate hard mask layer 29 is formed over the second gate conductive layer 28. The gate hard mask layer 29 may include one selected from the group consisting of an oxide layer, nitride layer, nitride oxide layer, C containing layer, and a combination thereof.

A hard mask pattern is formed over the gate hard mask layer 29. The gate hard mask layer 29, second gate conductive layer 28, first gate conductive pattern 27A, and anti-interference layer 25 are etched to form a plurality of gate lines simultaneously crossing the isolation region 22 and active region 23.

The gate line crossing the isolation region 22 includes the anti-interference pattern 25A formed over the substrate 21. That is, an anti-interference pattern 25A is formed between the passing gate and the substrate 21. The physical gap between the main gate and passing gate is increased. Thus, the passing gate effect is reduced.

In this invention, the gate line crossing the isolation region includes the anti-interference pattern formed over the substrate. Thus; the physical gap between the main gate and passing gate is increased and the passing gate effect is reduced.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for fabricating a semiconductor device, the method comprising:
    forming an anti-interference pattern over a substrate including an isolation region and an active region, the anti-interference pattern covering an entire surface of the isolation region and exposing a portion of the active region;
    forming a gate conductive layer over a resultant structure including the anti-interference pattern;
    forming a gate hard mask layer over the gate conductive layer; and selectively etching the gate hard mask layer, the gate conductive layer, and the anti-interference pattern to form a plurality of gate lines crossing the isolation region and the active region.

2. The method of claim 1, wherein the anti-interference pattern includes one selected from the group consisting of an oxide layer, a nitride layer, an oxynitride layer, a carbon containing layer, and a combination thereof.

3. The method of claim 1, wherein the anti-interference pattern has a thickness of approximately 100 Å to approximately 1,000 Å.

4. The method of claim 1, wherein forming the gate conductive layer comprises:

forming a first gate conductive layer over a resultant structure including the anti-interference pattern;

planarizing the first gate conductive layer; and forming a second conductive layer over the planarized first gate conductive layer.

5. The method of claim 4, wherein the first gate conductive layer is a polysilicon layer.

6. The method of claim 1, further comprising etching the substrate in the active region using the anti-interference pattern as an etch barrier to form a recess pattern only in the active region.

7. The method of claim 6, wherein the recess pattern is of one selected from the group consisting of a polygon type, a bulb type, and a saddle type.

* * * * *